HIGH SPEED BINARY COUNTER

Filed June 25, 1964 2 Sheets-Sheet 1

INVENTOR
N. S. WAGNER
BY Roy M. Porter, Jr.
ATTORNEY 3,278,760

HIGH SPEED BINARY COUNTER

Nicholas S. Wagner, Rahway, N.J., assignor to Bell Telephone Laboratories, Incorporated, New York, N.Y., a corporation of New York

Filed June 25, 1964, Ser. No. 377,970
7 Claims. (Cl. 307—88.5)

This invention relates to binary counting circuits and more particularly to binary counting circuits employing a high speed bistable flip-flop operating from a unipolar source.

Logic circuitry with two stable output voltage states such as bistable flip-flops are useful in digital systems to perform frequency division or counting functions in the control of the operations of system components. The bistable flip-flops existing in the art are generally either of a first type having two inputs and requiring a pulse at each of the two inputs in an alternating fashion to supply the proper drive, or of a second type having a single input and requiring a bipolar drive pulse. For numerous reasons such as high speed requirements of counting circuits it has been found useful to employ the second type of flip-flops having a single input. Moreover, in many instances it is desired, in the interest of simplicity of circuitry, to drive this type of flip-flop from a unipolar input source.

Accordingly, it is an object of this invention to provide an improved binary counting circuit.

Another object of this invention is to provide a reliable binary counting circuit characterized by high speed capabilities and simplicity of design.

Still another object of this invention is to provide a counting circuit which affords both isolation and gain between input and output terminals.

Yet another object of this invention is to provide a pulse dividing circuit having an adjustable duty cycle.

In the broadest aspect of the invention these and other objects are realized by providing a high speed single input bistable flip-flop and a negative gain gating circuit which is responsive to the coincidence of the flip-flop output voltage applied thereto via a feedback path and a unipolar pulse source. Pulses from the unipolar source are split into two paths, a first of which drives the gating circuit and a second path which, together with the output of the gate, is connected to the flip-flop input. The state of the bistable flip-flop is changed each time a pulse arrives via a different path having a different polarity. As contemplated by the invention a preferred embodiment utilizes in combination a switching transistor and a negative resistance diode biased for bistable operation as the flip-flop element.

In accordance with a principal feature of the invention a bistable flip-flop having a single input is driven by means of a gating circuit from a unipolar input source.

It is another feature of this invention that the flip-flop stage comprises a switching transistor and a tunnel diode biased for bistable operation.

It is yet another feature of this invention that a four-layer semiconductor triode device can be used as a flip-flop element to provide high voltage switching in connection with the gating circuit provided.

It is still another feature of this invention that the circuit can be judiciously modified by the insertion of delay elements to produce an output wave form of adjustable duty cycle.

A complete understanding of the present invention and of the above and other features and advantages thereof may be gained from a consideration of the following detailed description of the invention as presented hereinbelow in connection with the accompanying drawings in which.

Figure 1:
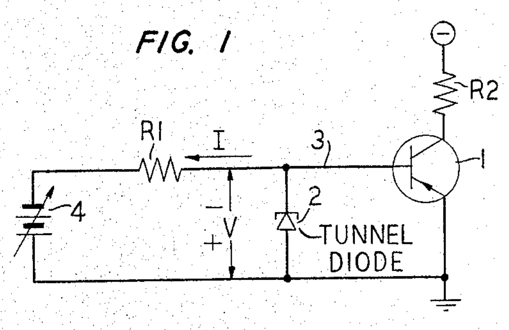
FIG. 1 depicts the basic high speed transistor tunnel diode flip-flop.

In accordance with the preferred embodiment of the invention, FIG. 1 shows the basic high speed transistor tunnel diode switch employing a high speed switching transistor 1 in a common emitter configuration with a negative resistance device such as tunnel diode 2 connected between the base and emitter electrodes. Tunnel diodes and their operative characteristics are described in the literature: see for example, H. S. Sommers, Jr. in the Proceedings of the I.R.E. July 1959 at page 1201. The diode 2 is connected to the transistor electrodes and biased so that either a fixed low voltage or a fixed higher voltage appearing across the diode during the stable operation thereof is applied to the base emitter junction of transistor 1 to bias the transistor switch in its cutoff or its saturated state, respectively, as will be explained hereinafter in connection with FIG. 2.

Figure 2:
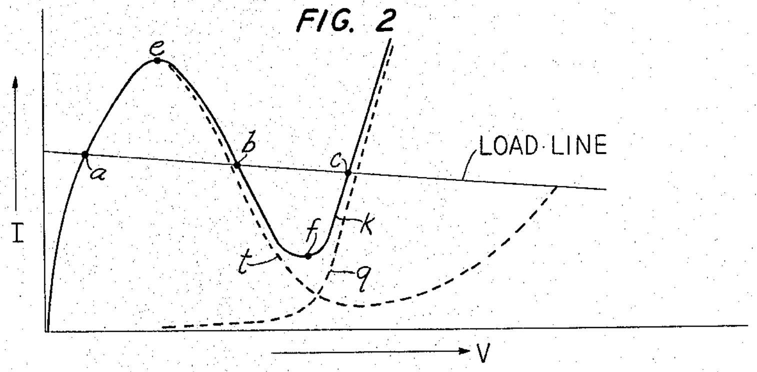
FIG. 2 is a volt ampere characteristic useful in explaining the operation of this transistor tunnel diode flip-flop.

The composite switch current I as a function of the switch voltage V, which quantities are defined by reference to FIG. 1, are graphically shown in FIG. 2 along with the separate volt ampere characteristics of the transistor and the tunnel diode. If the base lead 3 of FIG. 1 is opened up and a plot of the characteristics of the tunnel diode is made with the aid of variable source 4, the dotted curve labeled $t$ in FIG. 2 is obtained. Similarly, if tunnel diode 2 is removed from the circuit of FIG. 1 and a plot is made of the volt ampere characteristics of the emitter-base junction of the transistor, the dotted curve $q$ is obtained. Therefore, when the two semiconductor devices are connected as shown in FIG. 1 the resultant composite characteristic is obtained by the superposition of curves $t$ and $q$ as depicted by the solid curve $k$ of FIG. 2. In the low voltage region, curve $k$ approximates curve $t$ since the transistor base current in this region is very much smaller than the tunnel diode current, while in the higher voltage region where transistor base current dominates, the tunnel diode current curve $k$ approximates curve $q$.

A load line whose slope corresponds to the negative slope of resistance R1 (shown in FIG. 1) can be plotted on the coordinates of FIG. 2. When the value of this resistor is judiciously chosen, the load line intersects the composite curve $k$ at three points $a$, $b$, and $c$. Point $b$ is in a region of negative resistance and therefore represents an unstable condition of the switch. Points $a$ and $c$, however, exist on portions of the composite characteristic having positive slope and, therefore, correspond to the portions of the curve representing positive values of resistance and thereby represent stable conditions. It is to be noted that point $a$ is a low voltage stable point of operation while point $c$ is a relatively high voltage stable point of operation.

Thus, it is evident that by employing the extremely fast switching and bistably biased tunnel diode in combination with a switching transistor a fast switch is obtained that provides two stable output voltages at the collector of the transistor which can be made to differ in sufficient magnitude from each other so that a practical and useful bistable flip-flop device is obtained. The output voltage will change from one stable value to the other in response to pulses of alternating polarity applied at the single input terminal.

Figure 3:
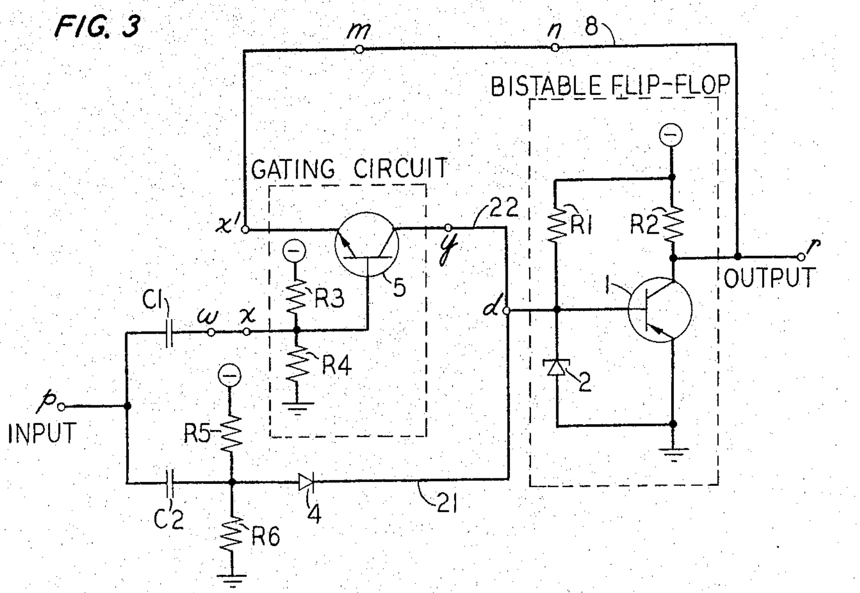
FIG. 3 is a schematic diagram of one form of the counting circuit employing the transistor tunnel diode flip-flop and embodying the principles of the present invention.

FIG. 3 is a schematic circuit of the preferred embodiment of the invention employing the above transistor tunnel diode flip-flop. Shown in FIG. 3 is a bistable flip-flop having a single input terminal *d* and an output terminal *r* which functions also as the counter output terminal. Also included in FIG. 3 is a transistor gating circuit having input terminals *x* and *x'* and output terminal *y* arranged so that an input pulse applied to terminal *x* is permitted to pass to output terminal *y* only when terminal *x'* is at the proper potential as determined by the flip-flop output voltage at terminal *r*. Input pulses applied to the input terminal *p* of the counter are split up into two input paths, the first of which is capacitor coupled by means of capacitor C1 to gating circuit input terminal *x* and the second of which is capacitor coupled by means of capacitor C2, diode 4, conductor 21 to the bistable flip-flop input terminal *d*. The output terminal *y* of the gating circuit is also connected by means of conductor 22 to the input terminal *d* of the bistable flip-flop.

The gating circuit comprises a transistor switch whose base is biased from a negative source by means of resistors R3 and R4 to a negative voltage whose magnitude is comparable to or slightly larger than the magnitude of the positive input voltage pulses. Diode 4 which functions as an isolating element is biased by means of the negative source and resistors R5 and R6 to a voltage which is slightly more negative than the magnitude of the voltage drop across the tunnel diode 2 when the bistable flip-flop is operating at the stable point *c* of FIG. 2.

The operation of the circuit shown in FIG. 3 can be better understood if reference is made to the wave forms shown in FIG. 5. It will be assumed that the flip-flop is initially in the ON or operated condition as represented by point *c* of FIG. 2 and that, therefore, the collector and emitter junctions of transitor 1 are forward biased and saturated so that the output voltage and consequently conductor 8 is approximately at ground potential.

This potential condition at the output will be designated as the SET state of the flip-flop during which diode 4 is slightly back-biased because of the conditions noted above. The RESET state of the flip-flop exists when the transistor tunnel diode switch is biased at point *a* of FIG. 2 so that no collector current flows through transistor 1 and the output voltage and consequently the potential on conductor 8 is that of the negative source provided. Dioded 4 is more heavily back-biased during this condition.

Figures 5A, 5B, 5C, 5D, 5E:
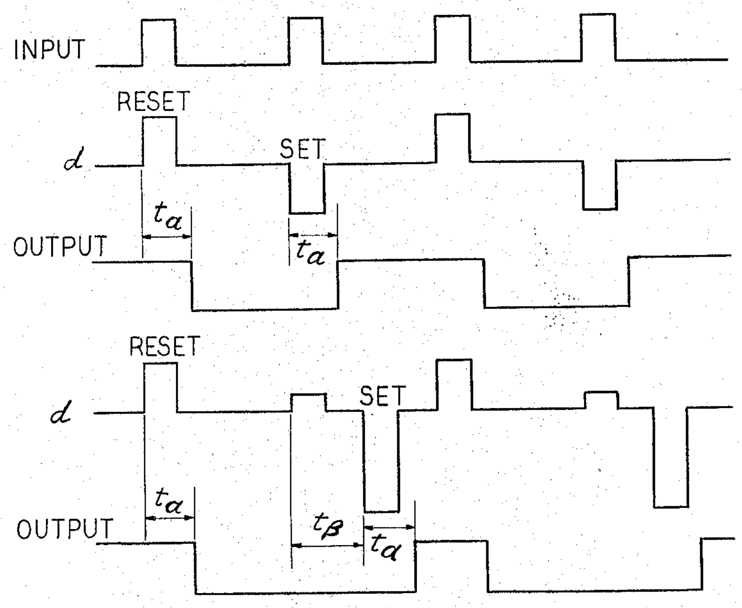

With the flip-flop initially in the SET condition, a first incoming input pulse as shown by FIG. 5*a* is applied to input terminal *d* by means of the second input path described above, or through diode 4, to cause the flip-flop to change to its RESET state. The wave form at terminal *d* is illustrated in FIG. 5*b* and is approximately a reproduction of the first input pulse since diode 4 had been only slightly back-biased. It can be seen by reference to FIG. 2 that this change of state occurs because the pulse appearing at the input to the flip-flop causes the flip-flop input current to drop from the value at point *c* to a value below that of point *f*, after which the unstable region is very quickly traversed until the stable state *a* is reached.

FIG. 5*c* shows the wave form at the output of the counter and indicates that the output voltage changes from ground potential to the negative source potential after a time delay at $t_a$ which represents the switching delay (assuming for the sake of simplicity that the switch turn-on time equals the turn-off time) inherent in the bistable flip-flop switch or more accurately the switching time of transistor 1. This delay, if not larger than the time duration of the input pulse, can be increased by the inclusion between terminals *m* and *n* in conductor 8 of a suitable delay element.

The gating circuit does not permit the first input pulse of FIG. 5*a* to appear at gating circuit output terminal *y* since the transistor gate is in a closed condition during the time the flip-flop is in its SET state. This is readily seen by reference to the voltages present at gating input terminals *x* and *x'*. During the SET state of the flip-flop the output terminal *y* and therefore terminal *x'* (which is connected by means of conductor 8 to the emitter of transistor 5) is at ground potential and terminal *x* (and consequently the base of transistor 5) is biased to a negative potential by resistors R3 and R4 as indicated above. With the potentials just described appearing on terminals *x* and *x'*, the base-emitter junction of transistor 5 is sufficiently back-biased so that the magnitude of the incident positive input pulse at terminal *x* will be insufficient to forward-bias the junction.

When the second input pulse of FIG. 5*a* appears, the flip-flop has been stably established in its RESET state with output terminal *r* at the negative source potential. Therefore, since input terminal *x'* and consequently the emitter of transistor 5 is at the negative source potential, and the base electrode is at the negative potential described above, the base-emitter junction of transistor 5 is slightly back-biased to fix the gate at the threshold of operation. The second input pulse, therefore, opens the gating circuit and appears inverted at terminal *y* appropriately amplified in magnitude after a switching time delay which for present purposes will be deemed insignificant and inconsequential. The effect of the input pulse which has been amplified by the gating circuit and applied to terminal *d* is shown in FIG. 5*b* and represents the super-position of this amplified and inverted pulse arriving via the first input path with the input pulse unamplified and arriving via the second input path. It is also to be noted that during the RESET state tunnel diode 2 is in the low voltage state as represented by point *a* in FIG. 2 with a potential at point *d* which is only slightly negative. As a consequence of this, diode 4 is more heavily back-biased than before thereby presenting a greater impedance to the input pulse arriving at point *d* via the path in which it is included.

The second pulse shown in FIG. 5*b* is accordingly designated as the SET pulse since it is negative in value and when applied to flip-flop input terminal *d*, causes the flip-flop after the time delay $t_a$ as shown on FIG. 5*c* to change from its RESET state to its SET state. This occurs, if reference is made to FIG. 2, by increasing the switch input current from the value at point *a* to a value above that of point *e* so that the stable point *c* is reached.

The output voltage of the counter as represented in FIG. 5*c* continues at the zero or high voltage level until the incidence of the next or third input pulse which effects a change in the flip-flop state in exactly the same manner as the first input pulse. It is, therefore, obvious by comparing FIGS. 5*a* and 5*c* that the counter output changes state, or voltage levels, once for each input pulse and consequently provides one output pulse for every two input pulses.

The counter circuit can be modified by including a delay element 23 between terminals *w* and *x* (at the input of the gating circuit) for the purpose of varying the width of the counter output pulse to a desired duty cycle. By reference to FIGS. 5*a*, 5*d*, and 5*e* it is seen that the duty cycle of the counter output voltage is made dependent upon the magnitude of delay introduced by element 23.

As before, if the output is initially in the SET state, the first incoming input pulse appearing at the counter input causes the output after the time delay $t_a$ to change to the RESET state as shown in FIG. 5*e*. Since as before the first input pulse of FIG. 5*a* arrives at terminal *d* via the second input path which includes diode 4, the wave form at FIG. 5*d* is a duplication of a first input pulse exactly as described above. Now, however, when the second input pulse arrives, and the gating circuit has the proper input potential at terminals $x$ and $x'$ to allow the gate to open, the input pulse first gets through to terminal $d$ via the second input path (which includes the diode 4 in its more heavily back-biased state) as depicted in FIG. 5*d* by the small positive going pulse in the time slot corresponding to the second input pulse of FIG. 5*a*. Moreover, since the flip-flop is already in the RESET state, the positive pulse appearing at terminal $d$ does not effect any change of state. After a time delay $t_\beta$ introduced by the delay time of the delay element inserted between terminals $w$ and $x$ (and including the inherent switching time of transistor 5) the second input pulse traveling via the first input path (the path including gating transistor 5) arrives at terminal $d$ inverted and amplified in magnitude. This negative pulse at flip-flop input terminal $d$ causes the flip-flop to change from the RESET to the SET state in exactly the same manner as the SET pulse in FIG. 5*b* as described above. Again, the output changes from the negative potential to the positive potential after the time delay $t_a$ shown in FIG. 5*e*.

By comparing the widths of the output wave forms shown in FIGS. 5*c* and 5*e*, it is readily seen that the inclusion of a variable delay of magnitude $t_\beta$ between terminals $w$ and $x$ makes the counter a more versatile circuit in its added ability to adjust the output pulse width or duty cycle. For example, the duty cycle can be adjusted so that, except for amplification, the counter acts as a pulse divider which exactly transmits to the output every other input pulse.

It is to be mentioned that by suitably choosing semiconductor components, the circuit of FIG. 3 can be made to operate reliably in response to a 500 megacycle repetition rate input pulse. Also, while the diode 4 and biasing resistors R5 and R6 as shown aid in the operation of the circuit at very high frequencies, these elements are not essential when the counter operates at a slower rate.

Figure 4:
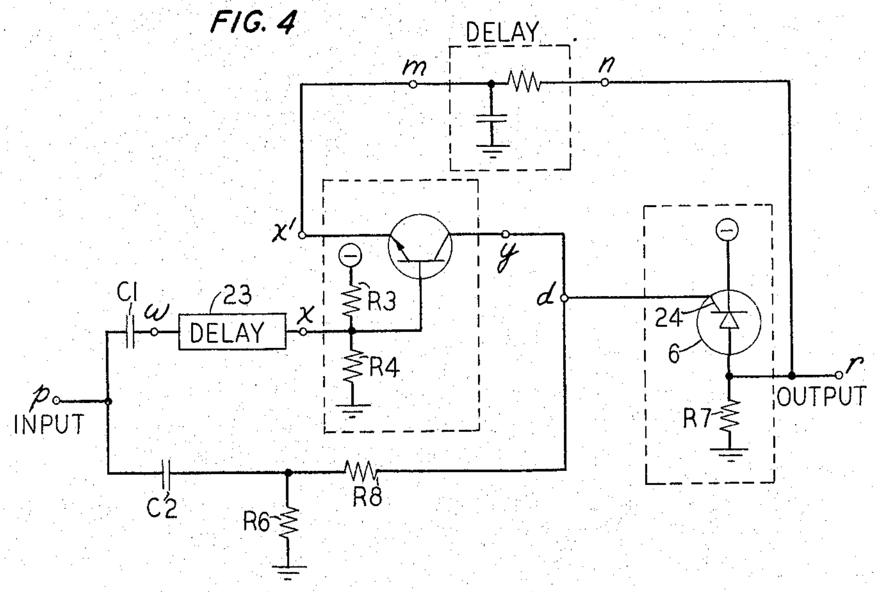
FIG. 4 is another schematic diagram showing a second embodiment of the invention using a pnpn triode as the flip-flop element; and FIGS. *5a*, *5b*, *5c*, *5d*, and *5e* illustrate various idealized wave forms characteristic of the circuits shown in FIGS. 3 and 4.

FIG. 4 shows another embodiment of the invention and illustrates how delay elements can be included at the points mentioned above. A delay element such as a coaxial delay line may be inserted between the terminals $w$ and $x$ as shown. Also shown is the insertion of an RC delay circuit between the terminals $m$ and $n$ and the elimination of the diode 4 and its biasing arrangement. This circuit performs exactly as described above with the exception that a pnpn triode semiconductor 6 which is biased for bistable operation is substituted for the transistor-tunnel diode flip-flop. Devices of this type have wide application and have been frequently described in the literature. For example, see "Three-Terminal P-N-P-N Transistor Switches," I. M. Mackintosh, IRE Transactions on Electron Devices, vol. ED-5 January 1958 pages 10–12; "General Electric Controlled Rectifier Manual" First edition, 1960 pages 7–12. An advantage afforded by the use of this device is the capability of switching a high voltage source.

When the device is arranged for bistable operation as shown in FIG. 4 the application of a positive voltage of sufficient magnitude to control terminal 24 causes the device to exhibit a low forward impedance. A subsequent application of a negative pulse of sufficient magnitude to terminal 24 causes the device to revert back to a very high forward impedance state.

Since the only substantial difference between the circuits of FIGS. 3 and 4 are the devices used for the bistable flip-flop, the wave form at point $d$ is identical to that shown in FIG. 5*d* when the input wave form is as shown in FIG. 5*a*. If initially triode 6 is in the high impedance state, the output voltage at terminal $r$ is approximately at ground potential. As before, the first incoming pulse passes through diode 4 and causes the pnpn triode device to change to its low forward impedance value and the output voltage at terminal $r$ falls to approximately the negative source potential. The subsequent arrival of the negative SET pulse shown in FIG. 5*d* causes the triode 6 to revert to its high impedance state with the consequent change of potential at output $r$. Since the operation of FIG. 4 is substantially identical to the operation of the circuit of FIG. 3 it is obvious that the output wave form of the circuit of FIG. 4 will be identical to that shown in FIG. 5*e* (or that shown in FIG. 5*c* if the delay elements are removed).

It is to be understood that the above-described arrangements are illustrative of the application of the principles of the invention. Numerous other arrangements may be devised by those skilled in the art without departing from the spirit and scope of the invention.

What is claimed is:

1. A counting circuit responsive to a unipolar pulse source comprising a bistable flip-flop circuit having input and output circuits and exhibiting first and second output potentials in said output circuit in response to current pulses applied to said input circuit of a first polarity and a second opposite polarity, respectively, said polarities being relative to a reference potential existing at said input circuit in the absence of a pulse, a path directly interconnecting said unipolar source having said first polarity and said input circuit for applying each pulse from said source to said input circuit, and means including a gating circuit interconnecting said unipolar source and said flip-flop input circuit responsive to the concurrence of said first potential in said flip-flop output circuit and a pulse from said source for applying a pulse of said second opposite polarity to said input circuit of said flip-flop.

2. A counting circuit in accordance with claim 1 wherein said bistable flip-flop comprises a transistor having input, output and common electrodes and a negative resistance diode connected between said input and common electrodes, and wherein said input electrode corresponds to said input circuit and said output electrode corresponds to said output circuit.

3. A counting circuit in accordance with claim 1 wherein said bistable flip-flop comprises a bistably biased four layer pnpn semiconductor device having first, second and third electrodes, said first electrode corresponding to said input circuit and said second electrode corresponding to said output circuit.

4. A counting circuit in accordance with claim 1 wherein said gating circuit comprises a transistor having a first electrode connected to said flip-flop output circuit, a second electrode coupled to said source and an output electrode connected to said cip-flop input circuit, and wherein said transistor is responsive during the application of said first potential to said first electrode to amplify and invert a pulse from said source.

5. A counting circuit responsive to a unipolar pulse input source of a first polarity including a bistable flip-flop comprising a transistor having input, output and common electrodes and a negative resistance diode connected between said input and common electrodes, said output electrode having a first value of potential in response to the application of said first polarity pulse to said input electrode and a second value of potential in response to the application of a second opposite polarity pulse to said input electrode, said polarities being relative to a reference potential existing at said input electrode in the absence of a pulse, and pulse input means for coupling said source to said flip-flop input electrode comprising means for directly coupling each pulse from said pulse input source to said input electrode and transistor amplifier gating means interconnecting said source and said input and output electrodes of said flip-flop transistor responsive to the concurrence of said first potential existing in said output electrode and a pulse from said first polarity source for transmitting a pulse of said opposite polarity to said flip-flop input electrode.

6. A counting circuit in accordance with claim 5 wherein said pulse input means comprises a first conducting path interconnecting said pulse source and said flip-flop including a coupling capacitor and a back-biased diode isolating means, a second conducting path interconnecting said pulse source and said flip-flop including a coupling capacitor, a delay element of selected time delay parameters and said gating means, wherein said gating means further comprises a negative gain transistor amplifier having a first electrode connected to said delay element, a second electrode connected to said flip-flop output electrode and a third electrode connected to said flip-flop input electrode and wherein said gating means during the existence of said first potential value of said flip-flop output electrode amplifier inverts and transmits a pulse from said source to said flip-flop input electrode.

7. A pulse divider responsive to a unipolar pulse input source of a first polarity for producing a variable duty cycle output wave form comprising a bistable flip-flop having a single output terminal and a single input terminal, said output terminal having a first value of potential in response to the application of said first polarity pulse to said input terminal and a second value of potential in response to the application of a second opposite polarity pulse to said input terminal, said polarities being relative to a reference potential existing at said input terminal in the absence of a pulse; a first conducting path connected to said source for directly coupling each pulse from said pulse input source to said input terminal; and a second path means interconnecting said source and said input terminal for transmitting a second opposite polarity pulse including an element connected to said source for introducing a specified time delay to a pulse and a negative gain transistor amplifier having a first electrode connected to said flip-flop output terminal, a second electrode connected to said flip-flop input terminal and a third electrode connected to said time delay element, said transistor being responsive to the simultaneous appearance of said first value potential on said first electrode and a pulse from said source on said third electrode to transmit said source pulse to said second electrode in an amplified and inverted form.

References Cited by the Examiner

UNITED STATES PATENTS

| | | | |
|---|---|---|---|
| 2,888,560 | 5/1959 | Talambiras. | |
| 2,974,238 | 3/1961 | Lohman | 307—88.5 |
| 3,047,737 | 7/1962 | Kolodin | 307—88.5 |
| 3,102,209 | 8/1963 | Pressman | 307—88.5 |
| 3,150,273 | 9/1964 | Dym | 307—88.5 |
| 3,174,057 | 3/1965 | Cake | 307—88.5 |
| 3,207,929 | 9/1965 | Kruy | 307—88.5 |

OTHER REFERENCES

Richards, Digital Computer Components and Circuits (textbook), Van Nostrand Company, New York, 1957, pp. 96, 108, 109, 110 and 111.

Fisher, Transistor-Esaki Diode Shift Register, IBM Technical Disclosure Bulletin, vol. 4, No. 9, February, 1962, pages 45 and 46.

ARTHUR GAUSS, *Primary Examiner.*

I. C. EDELL, *Examiner.*